United States Patent [19]

DiPaolo et al.

[11] Patent Number: 5,215,610

[45] Date of Patent: Jun. 1, 1993

[54] METHOD FOR FABRICATING SUPERCONDUCTOR PACKAGES

[75] Inventors: Nunzio DiPaolo, Poughkeepsie; Ananda H. Kumar, Hopewell Junction; Lovell B. Wiggins, Hopewell Junction, all of N.Y.

[73] Assignee: International Business Machines Corporation, Armonk, N.Y.

[21] Appl. No.: 680,227

[22] Filed: Apr. 4, 1991

[51] Int. Cl.$^5$ .............................................. C04B 37/00
[52] U.S. Cl. ........................................ 156/89; 264/61; 264/65; 264/66
[58] Field of Search ................. 156/89; 252/518; 228/121, 903; 419/10, 19, 34, 46, 47, 57, 58; 264/61, 65, 66

[56] References Cited

U.S. PATENT DOCUMENTS

| | | | |
|---|---|---|---|
| 3,676,292 | 7/1972 | Pryor et al. | 156/89 |
| 3,725,091 | 4/1973 | Chyung et al. | 419/19 |
| 3,963,449 | 6/1976 | Seki et al. | 419/19 |
| 4,079,156 | 3/1978 | Youtsey et al. | 427/96 |
| 4,234,367 | 11/1980 | Herron et al. | 156/89 |
| 4,301,324 | 11/1981 | Kumar et al. | 174/68.5 |
| 4,594,181 | 6/1986 | Siuta | 252/512 |
| 4,816,615 | 3/1989 | Prabhu et al. | 174/68.5 |
| 4,840,654 | 6/1989 | Pryor | 65/18.1 |
| 4,861,646 | 8/1989 | Barringer et al. | 428/210 |

*Primary Examiner*—Jan H. Silbaugh
*Assistant Examiner*—Christopher A. Fiorilla
*Attorney, Agent, or Firm*—Ira David Blecker

[57] ABSTRACT

A method for promoting adhesion of cofired copper-based metallurgy and glass ceramic dielectric materials. The method includes the step of adding powder of an alloying metal to the copper based metallurgy prior to firing. A paste which exhibits superior adhesion to glass ceramics includes an organic carrier, copper powder, and an alloying metal, which may be a non-copper metal powder or a copper-metal alloy. It is preferred that of the metal in the paste, the copper should make up 80-99 weight percent and the alloying metal should make up 1-20 weight percent.

4 Claims, No Drawings

METHOD FOR FABRICATING SUPERCONDUCTOR PACKAGES

The invention relates generally to the adhesion of ceramic to associated metallurgy. More specifically, the inventive method provides alloying additions to a copper paste to promote adhesion of the copper-based metallurgy to the glass-ceramic package.

BACKGROUND OF THE INVENTION

In the fabrication of packaging for integrated circuits, the technology has moved in the direction of dielectrics having low co-efficients of thermal expansion, such as the glass-ceramic compositions taught by Herron, et al in U.S. Pat. No. 4,234,367 and Kumar, et al in U.S. Pat. No. 4,301,324 (which are assigned to the present assignee and hereby incorporated by reference). The co-efficients of thermal expansion for the crystallizable glass-ceramic compositions disclosed therein, B-spodumene ($Li_2O \cdot Al_2O_3 \cdot 4SiO_2$) and cordierite ($2\ MgO \cdot 2Al_2O_3 \cdot 5SiO_2$) more closely match that of silicon, of which the integrated circuits are fabricated. As discussed in the above-referenced patents, use of the glasses having lower firing temperatures necessitates the use of metallurgy, which will sinter at or about the crystallization temperature of the glass. Copper-based metallurgy is preferred given its low sintering temperature, good conductivity and reasonable cost and availability.

To fabricate a package of a crystallized glass-ceramic dielectric having associated copper-based metallurgy, one employs the early alumina "greensheet" technology in which a slurry of the glass-ceramic precursors and polymeric binders is cast into sheets, dried, embossed with a pattern for the metallization and metallized with a paste comprising the conductive metal (or a precursor thereof) and at least one organic vehicle. When a plurality of sheets have been appropriately patterned and metallized, the sheets are stacked and laminated into a green (unfired) package. Firing is conducted following a prescribed firing profile to assure the heating and atmospheric conditions sufficient to effect burn-off of the relevant organics, maximum densification and crystallization of the glass-ceramic with attendant sintering of the metallurgy.

The drawbacks associated with the choice of a copper-based metallurgy include the constrained firing profile, requiring an atmosphere which is non-oxidizing to the copper, whereas an oxygen-rich atmosphere would be most advantageous for effecting removal of the organics. In addition, copper does not adhere well to the dielectric materials, leaving voids which compromise hermeticity and connectivity in the finished product. Moreover, the rate of shrinkage of the copper differs significantly from that of the dielectric, again affecting both the electrical properties and the hermeticity of the package. Finally, and most detrimentally, the pure copper powders can begin to sinter and shrink at temperatures as low as 400° C., far below the temperature for the onset of coalescense of the glass-ceramics. Premature sintering can lead to severe distortion of the package and the device-threatening effects of trapping of gases from the volatizing organic carriers.

Those skilled in the art have attempted to address each of the above-identified concerns individually. Prabhu, et al, in U.S. Pat. No. 4,816,615, teach the addition of an inert glass frit to the conductor paste to delay sintering for a length of time sufficient to allow the organic vehicle in the paste to burn off, thereby minimizing voids and the other undesirable effects of trapped contaminants. An obvious drawback of glass frit additions is that the conductivity of the metallurgy is compromised.

The adhesion concern, noted above, has also been addressed by the addition of glass or ceramic compositions. Rather than as inert fillers, however, the adhesion promoting additions are chosen to bond to the metal of choice. The Pryor, et al. U.S. Pat. No. 3,676,292 teaches the use of $Al_2O_3$ coatings on copper particles to promote adhesion of the copper metallurgy to the glass or ceramic workpiece. The teachings of Siuta, in U.S. Pat. No. 4,594,181, also employ metal oxide coatings on copper metallurgy. The Siuta additives are introduced to delay sintering and also to reduce the shrinkage of the metallurgy to ~15% to more closely match the overall shrinkage of the glass-ceramic package. The Siuta method is to coat copper metal powder with a metal oxide by first coating the copper particles with an organometallic compound followed by heating in a reducing atmosphere to decompose the organometallic, thereby leaving a continuous metal-oxide coating on the copper. The preliminary processing has the obvious drawback of cost and processing time constraints. Moreover, there may be contaminants, present due to the preliminary processing, which have the potential of affecting both subsequent processing and end-product effectiveness.

The methods noted above have inherent drawbacks. Moreover, no one solution has been effective in addressing all of the challenges of the glass-ceramic/copper package processing, namely, shrinkage, premature sintering and adhesion.

It is, therefore, an objective of the present invention to provide additions to a metallizing paste which will not only delay sintering of the paste and match shrinkage of the paste to that of the glass ceramic, but also promote adhesion of the copper-based metallurgy to the glass-ceramic.

It is a further objective of the invention to provide a simplified method of delaying sintering and retarding shrinkage in copper-based metallurgy.

It is yet a further objective of the present invention to provide a metallizing paste which, upon firing, exhibits good adhesion to the associated glass-ceramic and which does not require glass additions to the metallizing paste.

It is still another objective of the subject invention to provide a sintering retardant to a metallizing paste which does not require undue processing prior to mixing the paste.

Yet another objective of the present invention is to provide paste additions which will not significantly compromise the electrical properties of the conductors.

SUMMARY OF THE INVENTION

These and other objectives are realized by the addition of powders of a metal for which an oxide coating can readily be formed on that metal's surface. In addition, the metals must be reasonably soluble in the glass which becomes the glass ceramic at the sintering temperatures. These properties of the selected powder additions are such that the metal additions can assist in retarding sintering, controlling shrinkage and promoting adhesion of the metallurgy to the dielectric not only by their very presence, but also, in some instances, by virtue of the chemical interactions effected by the temperatures and ambients encountered in the previously established firing schedule.

Thus, one aspect of the invention relates to a method for promoting adhesion of cofired copper-based metallurgy and glass-ceramic dielectric comprising the step of:

adding powders of an alloying metal to said copper-based metallurgy prior to firing.

Another aspect of the invention relates to a method for fabricating semiconductor packages comprising the steps of:

preparing a greensheet comprising crystallizable glass precursors and organic binders;

preparing a metallizing paste of 80–99 weight percent copper and 1–20 weight percent metal grains capable of alloying to said copper and having oxidized surfaces, said metallizing paste further including an organic carrier material;

screening said metallizing paste on said greensheets;

stacking and laminating said metallized sheets;

first heating said laminated stack in an inert atmosphere to a temperature sufficient for said metal grains to break out of said oxidized surfaces and alloy with said copper;

secondly heating said laminated stack in a steam ambient to a temperature sufficient to volatize said organics and effect oxidation of said copper-metal alloy;

thirdly heating said laminated stack in a neutral or reducing ambient to a temperature sufficient to effect crystallization of said crystallizable glasses; and cooling said stack.

A further aspect of the invention relates to a metallizing paste exhibiting superior adhesion to glass-ceramics comprising:

an organic carrier;

80–99 weight % copper powders; and

1–20 weight % non-copper metal powders.

A final aspect of the invention relates to a metallizing paste exhibiting superior adhesion to glass-ceramic comprising:

an organic carrier;

copper powders; and powders of a copper-metal alloy.

DETAILED DESCRIPTION OF THE INVENTION

In the past, as discussed briefly in the foregoing background section, the challenges encountered when using copper have been dealt with on a somewhat piecemeal basis. The constraints of the firing cycle developed for a glass-ceramic/copper package, along with the packaging needs in terms of materials compatibility, TCE, and electrical and strength properties, have limited the availability of solutions to the shrinkage, distortion, and adhesion problems. Substantially inert fillers have been added to physically delay sintering and limit shrinkage. Necessarily, the "inert" additives were found to negatively impact the electrical properties of the conductors. Nor could the adhesion concerns be rectified by the use of inert fillers. On the other hand, the presence of the seemingly ideal oxide, (i.e. copper oxide) is also ineffective with regard to adhesion. The poor wetting characteristics of copper to molten glasses and glass-ceramics when firing is due, the authors believe, to the easy solubility of copper oxide into the glasses coupled with poor adhesion of copper oxide to the copper metallurgy itself. It is, therefore, necessary to introduce neither just inert oxides nor highly soluble oxides, but rather, readily oxidizable metal additions to the metallurgical paste. The additions are metal powders selected from the group having the capability of readily forming coherent oxide films on their own surfaces, the oxides of which added metal have reasonable solubility in the glass without, at the same time, permitting the glass to strip the coherent oxide away from the metal surface (requiring, therefore, reasonable adhesive properties between the metal and its oxide coating). The presence of metals having oxidizable (or oxidized) surfaces provides both the physical control to shrinkage and densification along with the conductivity of metal additions. Metals from the group including aluminum, chromium, titanium, and tantalum meet the criteria discussed above. It is to be understood that this group listing is not exhaustive of the suitable metal candidates.

The mechanisms involved in the processing/firing cycle will be discussed further herein, with reference to the use of aluminum additions. Once again, it is to be noted that the inventive paste and process are not limited to the use of aluminum but, that aluminum is being discussed exclusively for the sake of clarity. The authors, however, have reduced the invention to practice using aluminum additions; and, given not only the oxidizing and solubility properties of aluminum, but also the alloying capability of aluminum with copper at the relevant temperatures, the authors speculate that use of aluminum is a preferred embodiment of the invention. The relevant non-alloying metal additions will be discussed subsequently.

Aluminum powder was added to a copper paste in the proportions of 90 weight % copper to 10 weight % aluminum (hereinafter referred to as the "alloying paste"). The aluminum powder consisted of aluminum grains having "naturally occurring" oxidized surfaces and required no preliminary processing. The paste was prepared using the standard organic binders (ethyl cellulose resin plus a solvent, wetting agent and flow control agent) into which the aluminum powders were merely blended. The paste was then applied in a metallization pattern to the glass-ceramic sheets. The top two layers of a multilayer ceramic package were fabricated using the "alloying paste," the layers stacked and laminated onto a stack of sheets fabricated with a prior art copper paste without aluminum powder, and the package fired. The firing cycle was not altered to address the presence of the aluminum additions. Rather, the standard firing profile was employed (see the previously-referenced Herron patent) wherein initial heating is conducted in an inert atmosphere, binder burn-off achieved with the use of a steam ambient, and densification and crystallization occur in an inert or reducing ambient.

The processing, prior to the subject invention, could result in copper sintering occurring during the initial heating phase, obviating the removal of paste binders and giving rise to the many negative consequences discussed above. With the subject invention, however, the aluminum additions (aluminum grains with aluminum-oxide surfaces) act as inert fillers during the initial heating steps, physically prohibiting the copper grains from contacting each other and thereby from prematurely sintering. Once the temperature exceeds the melting point of aluminum, at approximately 600° C., the aluminum additions take on a new role in the processing scheme. At the point at which the aluminum melts, the molten aluminum breaks out of its oxide coating and several mechanisms ensue. First, the molten aluminum coats and alloys with the surfaces of neighboring copper grains. This alloying step further prevents the sintering of copper. Moreover, during the steam phase of the firing, the aluminum-copper alloy readily forms an aluminum-oxide coating resulting in further retardation of copper sintering and further shrinkage control. Second, the "broken" aluminum-oxide fragments react with the glass phase in the glass-ceramic composition to improve the adhesion of the aluminum-copper containing conductor pattern to the glass-ceramic. As noted previously as an objective of the invention, it is not necessary to add other inert fillers or glass frit to the paste, since the aluminum assumes all of the roles of the previously employed additives. Upon completion of firing, the resultant structure is comprised predominantly of sintered copper particles, along with some partially and completely alloyed copper-aluminum grains, slivers of solidified aluminum and any added or infiltrated glass as well as porosity (a "component" of shrinkage control due to the presence of Cu-Al grains and the delayed sintering of the copper). The completed substrates exhibited vias in the top two layers which were firmly attached to the sidewalls of the glass-ceramic without exhibiting the phenomenon of via-to-glass-ceramic gap formation. Cross-sectional analysis and fluorescent dye penetrant photomicrographs verified the results of superior adhesion and hermeticity of the fired package.

The 90-10 weight percentage copper-aluminum paste was used as a representative sampling and does not comprise the entire invention. Given the cordierite glass-ceramic/aluminum-copper system being tested, the 90-10 ratio provided the ideal shrinkage characteristics desired in the metallurgy to match those of the specific glass-ceramic composition. The exact weight percentage of metal powder added will be a function of the desired shrinkage characteristics of the paste given the alloying and oxidizing capabilities and grain sizes of the metals employed. A range of about 1-20 weight percent of suitable metal added to the copper paste will yield the inventive results set forth herein.

It is additionally proposed that the invention can be modified by using pre-alloyed copper-aluminum powders in place of adding aluminum powders to the paste. The weight percentage should still fall into the 1-20 percent added metal to 99-80 percent copper for the desired results.

In the instances where higher temperature relevant metals are utilized, such as chromium, titanium and tantalum, the copper sintering regime is not affected by the presence of the readily oxidizable and oxide-soluble metals, since little alloying is observed. Therefore, the added metals rapidly form oxides which then act as "inert" fillers, at the lower temperatures. As the temperatures are elevated, the oxide skin may become discontinuous, thereby permitting sintering of the added metal to the copper particles. Such additions are, again, superior to the ceramic additions of the art since conductivity will not be significantly compromised. The metal additions become part of the electrically conducting path in the sintered body either through physical contact to or sintering with the neighboring copper particles. Again, adhesion to the glass ceramic is improved by the embedded oxide-coated metal or oxide particles. As noted above with the aluminum example, the weight percent of additive is proportional to the densification rate and is predetermined accordingly.

It is to be understood that further modification of the subject teachings may be conducted by one skilled in the art without exceeding the spirit and scope of the invention as recited in the appended claims.

What is claimed is:

1. A method for fabricating semiconductor packages comprising the steps of:
    preparing a plurality of greensheets comprising crystallizable glass precursors and organic binders;
    preparing a fritless metallizing paste of 80-99 weight percent copper and 1-20 weight percent metal grains capable of alloying to said copper and having oxidized surfaces, said fritless metallizing paste further including an organic carrier material;
    screening said fritless metallizing paste on said greensheets;
    stacking and laminating said metallized sheets;
    first heating said laminated stack in an inert atmosphere to a temperature sufficient for said metal grains to break off of said oxidized surfaces and forming an alloy with said copper;
    secondly heating said laminated stack in a steam ambient to a temperature sufficient to volatize said organics and effect oxidation of said copper-metal alloy;
    thirdly heating said laminated stack in a neutral or reducing ambient to a temperature sufficient to effect crystallization of said crystallizable glasses; and
    cooling said stack.

2. The method of claim 1 wherein said preparing of said metallizing paste comprises combining organic carriers, copper grains and pre-alloyed copper-metal grains with oxidized surfaces and wherein said copper:metal ratio is in the range of 80-99:1-20 weight percentage.

3. The method of claim 1 wherein said metal is selected from the group consisting of aluminum, chromium, titanium and tantalum.

4. The method of claim 3 wherein said metal is aluminum.

* * * * *